United States Patent (10) Patent No.: US 8,080,481 B2
Lee et al. (45) Date of Patent: Dec. 20, 2011

(54) METHOD OF MANUFACTURING A NANOWIRE DEVICE

(75) Inventors: Kook-Nyung Lee, Seoul (KR); Woo Kyeong Seong, Seongnam-si (KR); Suk-Won Jung, Osan-si (KR); Won-hyo Kim, Yongin-si (KR)

(73) Assignee: Korea Electronics Technology Institute (KR)

( * ) Notice: Subject to any disclaimer, the term of this patent is extended or adjusted under 35 U.S.C. 154(b) by 633 days.

(21) Appl. No.: 11/533,892

(22) Filed: Sep. 21, 2006

(65) Prior Publication Data

US 2007/0105321 A1 May 10, 2007

(30) Foreign Application Priority Data

Sep. 22, 2005 (KR) .................. 10-2005-0088325
Mar. 20, 2006 (KR) .................. 10-2006-0025126
May 2, 2006 (KR) .................. 10-2006-0039593
Aug. 25, 2006 (KR) .................. 10-2006-0080852

(51) Int. Cl.
*H01L 21/31* (2006.01)
*H01L 21/469* (2006.01)

(52) U.S. Cl. ........ 438/758; 438/128; 438/131; 438/800; 257/E51.04; 216/2

(58) Field of Classification Search .................. 438/758, 438/128, 131, 800; 257/E51.04; 216/2
See application file for complete search history.

(56) References Cited

U.S. PATENT DOCUMENTS 5,089,441 A * 2/1992 Moslehi .................. 438/800
5,405,454 A * 4/1995 Hirai et al. .................. 148/33.2
7,297,568 B2 * 11/2007 Kawakatsu et al. ............ 438/52
2003/0080082 A1 * 5/2003 Chinn et al. .................. 216/2
2007/0120273 A1 * 5/2007 Eckstein et al. ........ 257/E21.174

FOREIGN PATENT DOCUMENTS

WO    WO 2005076679 A2 *    8/2005

\* cited by examiner

*Primary Examiner* — Alexander Ghyka
*Assistant Examiner* — Leonard Chang
(74) *Attorney, Agent, or Firm* — Thomas, Kayden, Horstemeyer & Risley, LLP.

(57) ABSTRACT

The present invention provides a method for manufacturing a semiconductor nanowire device in mass production at a low cost without an additional complex nanowire alignment process or SOI substrate by forming a single crystal silicon nanowire with a simple process without forming an ultra fine pattern using an electron beam and transferring the nanowire separated from the substrate to another oxidation layer or insulation substrate. And also, the present invention suggests a method for simply manufacturing a nanowire device transferring the nanowire from a semiconductor substrate formed thereon the nanowire to another substrate formed thereon an insulation layer or the like.

10 Claims, 8 Drawing Sheets

(a)

(b)

(c)

(d)

(e)

(f)

(a)

(b)

(a)

(b)

(c)

(d)

(e)

(a)  (b)

METHOD OF MANUFACTURING A NANOWIRE DEVICE

FIELD OF THE INVENTION

The present invention relates to a method for manufacturing a nanowire device; and, more particularly, to a method for a method for manufacturing a nanowire device for transferring the nanowire on another substrate and forming an electrode structure after a semiconductor nanowire is manufactured by using a single crystal semiconductor substrate.

DESCRIPTION OF RELATED ART

Nanowire devices can be used as a transistor, which is a core component of various electronic devices and can be used as various chemical sensors and biosensors. If the nanowire devices operate with matching to each application, the nanowire and an electrode structure to measure or utilize an electrical property of the nanowire are required.

Manufacturing methods of such nanowire devices are greatly classified into two types, one is a "top-down" method to directly manufacture a nanowire device on a desired position by etching material such as silicon using a conventional semiconductor process such as an ultra fine photolithography process and the other is a "bottom-up" method that, after the nanowire is synthesized by using a method such as an VLS (Vapor-Liquid-Solid) growing method, manufactures the nanowire device by aligning the nanowire to a specific position.

A VLS growing method is used for growing a nanowire comprised of a most semiconductor and a metal material such Si, ZnO, GaN, InP, metal or the like. However, after a nanowire is selectively grown only on a desired position in order to manufacture the nanowire device by a bottom-up method or the manufactured nanowire is aligned to the desired position, an additional structure such as an electrode must be manufactured. A study on the selective growing method has been progressed to overcome a technical problem. The position control of the nanowire for the alignment can use a method to align the nanowire to the desired position through a method such as an electrophoresis for the nanowire device application or a method to align the nanowire by a fluid flow using Langmuir-Blodgett technique or a fluid channel.

However, although such methods are employed, it is very difficult to control the nanowire in such a way that it is accurately located at a desired place. And, there is a problem that a yield is very low even though the alignment process is performed. And also an additional electrode structure for an electric contact of the aligned nanowire functions as a stumbling block in improving a productivity of a nanowire device since the additional electrode structure is manufactured through an expensive e-beam lithography process.

Meanwhile, according to the method of manufacturing the nanowire device by using the top-down method, if a nanowire having a diameter of several nm is formed as the nanowire is directly manufactured by etching silicon, an ultra fine pattern formation process such as e-beam lithography is utilized since an ultra fine pattern formation is required. The top-down method has an advantage that the nanowire can be manufactured with a desired size on a desired position, but it is difficult in commercializing due to a very slow production speed since it utilizes an expensive apparatus such as the e-beam lithography. And also, the formed nanowire is non-uniform in comparison with the nanowire formed by the VLS method; and, since the nanowire is manufactured on the insulation material to play a role of an electric device, there is a shortcoming that the SOI substrate is employed. Although there is disclosed a method for manufacturing the nanowire by using a riffle structure obtained by repeating a dry etching proves of the silicon substrate and by thermally oxidizing the nanowire without using an ultra fine pattern, it is difficult to obtain a nanowire having a good quality since a surface roughness of the riffle obtained from the dry etching process is not easily controlled, and it is very difficult to reproduce the diameter of the nanowire with a reliability. In addition, in case when the nanowire is obtained by thermally oxidizing the riffle structure, there is a limitation in applying the nanowire since the nanowire is encompassed with an oxide.

SUMMARY OF THE INVENTION

It is, therefore, an object of the present invention to provide a method for manufacturing a nanowire device capable of being manufactured in mass production with a low cost by forming the nanowire having a desired diameter with a simple method in place of forming an ultra fine pattern using an electron beam.

It is another object of the present invention to provide a method for manufacturing a nanowire device without an additional complex nanowire alignment process or SOI substrate by transferring the silicon nanowire separated from the substrate to another oxidation layer or insulation substrate.

It is still another object of the present invention to provide a method for precisely transferring a nanowire to an intended position of the other substrate without losing the nanowire in a method for manufacturing the nanowire device.

It is still another object of the present invention to provide a method for preventing a bending phenomenon of a nanowire by minimizing a stress applied to the nanowire in a transfer process for transferring the nanowire to the other substrate.

It is still another object of the present invention to provide a manufacturing method capable of transferring a nanowire to only a desired position of the other substrate and improving a degree of integration of a nanowire device by repeatedly performing this.

It is still another object of the present invention to provide a nanowire device manufacturing method capable of variously manufacturing shapes of the nanowire without being constrained to a crystal direction of a silicon substrate during manufacturing the nanowire.

It is still another object of the present invention to provide a nanowire device manufacturing method that does not require to an additional substrate for transferring the nanowire to an SOI wafer.

In accordance with an aspect of the present invention, there is provided a method for manufacturing a semiconductor nanowire from a substrate, the method comprising the steps of: forming a first thermal oxide layer on a semiconductor substrate and patterning the first thermal oxide layer to secure a nanowire region and a support structure region for supporting the nanowire; dry etching the silicon substrate; wet etching the silicon substrate by using a silicon anisotropic etching solution; forming a second thermal oxide layer on the silicon substrate; and removing all of the thermal oxide layer.

In accordance with another aspect of the present invention, there is provided a method for manufacturing a semiconductor nanowire, the method comprising the steps of: forming a first thermal oxide layer on a semiconductor substrate and patterning the first thermal oxide layer to secure a nanowire region; dry etching the semiconductor substrate; wet etching the semiconductor substrate by using a silicon anisotropic etching solution; forming a second thermal oxide layer on the silicon substrate; removing an oxide layer placed on the semiconductor substrate and a top surface of a nanowire structure by using a dry etching; and forming a third thermal oxide on the semiconductor substrate.

In accordance with another aspect of the present invention are achieved by a nanowire device manufacturing method including the steps of: forming a semiconductor nanowire separated from a single crystal semiconductor first substrate; and transferring the nanowire to a second substrate.

In accordance with another aspect of the present invention, there is provided a method for manufacturing a semiconductor nanowire device, the method comprising the steps of: forming a supporting column structure and a vertical trench structure by etching a semiconductor first substrate using a reactive ion etching process; forming an undercut shape below the supporting column structure and the vertical trench structure by etching the semiconductor first substrate using a deep reactive ion etching process; forming the semiconductor nanowire by thermal oxidizing the semiconductor first substrate; removing a thermal oxide layer formed on the semiconductor first substrate so as to separate the semiconductor nanowire from the semiconductor first substrate; transferring the semiconductor nanowire formed on the semiconductor first substrate to the second substrate; and forming an electrode on the second substrate.

In accordance with another aspect of the present invention, there is provided a method for manufacturing a semiconductor nanowire device, the method comprising the steps of: patterning a semiconductor substrate by using a photoresist; forming a supporting column structure and a vertical trench structure by etching the semiconductor substrate using a reactive ion etching process; forming an undercut shape below the supporting column structure and the vertical trench structure by etching the semiconductor substrate using a deep reactive ion etching; forming a thermal oxide layer by thermal oxidizing the semiconductor substrate; etching the thermal oxide layer not so as to completely remove the thermal oxide layer between the semiconductor nanowire and the semiconductor substrate with exposing a top layer portion of the semiconductor nanowire; and forming an electrode on the semiconductor substrate.

The objects of the present invention are achieved by a nanowire device manufacturing method including the steps of: forming a column having a cross-section structure for supporting a top structure with a wide width by a bottom structure with a narrow width by dry etching and wet etching a single crystal silicon substrate; oxidizing the substrate; removing an oxidized portion; and depositing an electrode material on a nanowire supporting structure.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

A method for manufacturing a nanowire device in accordance with the present invention, after the nanowire is manufactured at a wafer level by using a semiconductor single crystal substrate, manufactures the nanowire device by transferring the nanowire into another substrate and patterning a metal electrode with a photolithography technique.

At first, after the substrate is anisotrophically etched and thermally oxidized, the nanowire floated from the semiconductor substrate manufactured by removing an oxidation layer and the nanowire separated from the substrate is transferred from the substrate where the nanowire is manufactured by the transfer method to an oxide or an insulation layer substrate according to needs. Herein, the nanowire can be transferred to a polymer or a plastic substrate according to applications. The transfer of the nanowire to the other substrate can be realized by the aid of a polymer or an adhesive such as a photoresist excellent adhesive characteristic to a waver substrate to be transferred and can directly fix the nanowire to the substrate through a bonding process. After the transfer of the nanowire is performed, the adhesive is removed by a dry etching using oxygen plasma; and, after removing the adhesive, the nanowire remains on a surface of the substrate due to the adhesion as it is. If an electrode structure for an electric contact is manufactured on the nanowire transferred substrate by a following process, the nanowire device can be manufactured in mass production at a low cost since the nanowire device can be manufactured at a wafer level.

And also, in the present invention, there is suggested a method that a nanowire device is manufactured by using a substrate formed thereon the nanowire without transferring the nanowire from the nanowire formed substrate to another substrate formed thereon an insulation layer or the like.

Hereinafter, preferred embodiments of the present invention will be described in detail with reference to the accompanying drawings.

Figure 1:
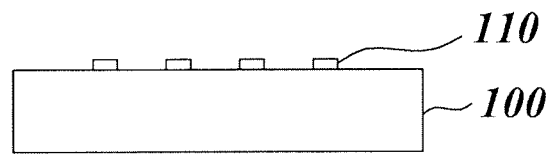
FIGS. 1 to 3 are diagrams showing a method for manufacturing a silicon nanowire and a method for manufacturing a nanowire device in accordance with one embodiment of the present invention.
Figure 1:
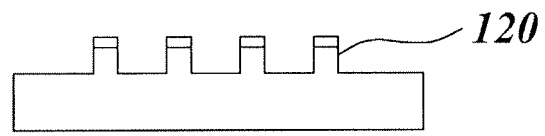
Figure 1:
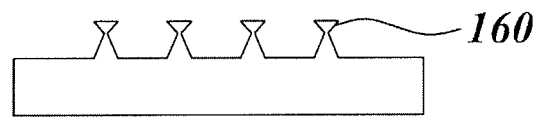
Figure 1:
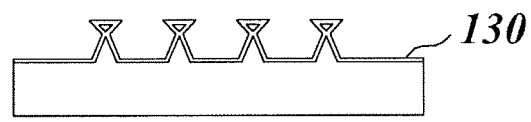
Figure 1:
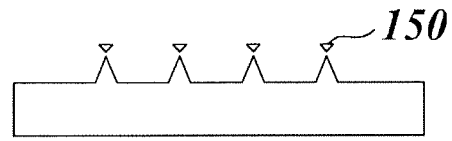
Figure 1:
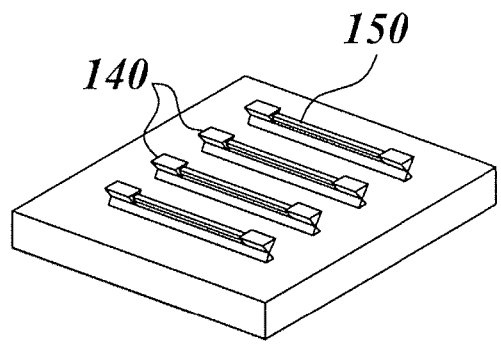

FIG. 1 sequentially shows a process of manufacturing a silicon nanowire in accordance with one embodiment of the present invention.

A first thermal oxidation layer 110 is formed on a silicon first substrate 100 of which a crystal structure has a direction of (100) and oxide layers formed on regions where a silicon nanowire and a supporting structure thereof are not formed are removed through a photolithography process as shown in FIG. 1a. Herein, in case when a stepper is utilized for the photolithography process, a line width of several hundreds nanometers can be realized. On the other hand, since a silicon nanowire 150 manufactured in accordance with the embodiment of the present invention can be a structure floated in air (released structure), there is a need that the silicon nanowire 150 is not lost or damaged by supporting both ends or one end of the silicon nanowire. Therefore, it is required to a pattern for a supporting structure 140 on one side end or both side ends of regions to be formed thereon the silicon nanowire 150. The region of the supporting structure 140 is not released from the silicon first substrate 100 after the following thermal oxidation removing process by making the region of the supporting structure 140 has a width wider than a line width of the silicon nanowire 150.

Nothing but, it is preferable that the width of the region of the supporting structure 140 is controlled wider not enough to smoothly perform a transfer process of the following nanowire. On the other hand, a connection member width between a region of the supporting structure 140 and a region of the nanowire 150 can be formed in narrower than a width of the nanowire region. This allows a portion breaking the nanowire in the following nanowire transfer process to be the connection member.

A column structure 120 is formed on the silicon first substrate 100 by using an anisotrophic dry etching such as a deep-RIE(reactive ion etching) process, as shown in FIG. 1*b*. An etching depth of the column structure 120 is controlled in a degree of a depth so as to easily implement the following silicon nanowire transfer process. The silicon first substrate 100 is wet etched by using a silicon anisotrophic etching solution such as KOH, as shown in FIG. 1*c*. In the wet etching, since the silicon first substrate 100 has an etching characteristic of (100) crystal direction, a cross-section of the column structure has a shape that a width of a central portion of the cross-section becomes narrower than that of a top portion or a bottom portion after the wet etching.

A second thermal oxidation layer 130 is formed by secondarily oxidizing the silicon first substrate 100, as shown in FIG. 1*d*. At this time, a top portion of a concave cross-section of the column structure forms the nanowire and a diameter of the silicon nanowire 150 can be controlled in a degree of several tens nanometers by controlling the time of the secondary thermal oxidation process. And also, the silicon nanowire 150 can be released from the substrate by allowing the concaved portion of the column structure 160 to be narrow or completely oxidized. Although the supporting structure 140 has a concave portion on a cross-section, but since the supporting structure 140 has an appropriately broad width, the concaved portion is not completely oxidized; and, even though the following thermal oxidation layer etching process is performed, the released nanowire is supported. Meanwhile, before the second thermal oxidation layer 130 is formed, the first thermal oxidation layer can be etched.

Thereafter, the thermal oxidation layers are removed by a wet etching using a BOE(buffered oxide etchant) or a plasma dry etching, as shown in FIG. 1*e*. If the thermal oxidation layer is removed, the silicon nanowire 150 of a diameter ranging from several nanometers to several hundreds nanometers and a length ranging from several micrometers to several hundreds micrometers is obtained, wherein both ends of the silicon nanowire 150 are supported by the supporting structure. On the other hand, in the thermal oxidation layer removing process, HF vapor can be utilized. This minimizes a loss of the nanowire during the removal process of the oxidation layer or the transfer process of the nanowire by minimizing stress applied to the nanowire and allows the following nanowire transfer process to be easily performed by reducing a bending phenomenon and a position change. On the other hand, it is preferable that a distance between the silicon first substrate 100 and the silicon nanowire 150 positioned on the top of the substrate ranges from several tens nanometers to several tens micrometers, such distance is determined by a wet etching degree of the silicon first substrate 100 when a depth of the dry etched column structure 120 and the column structure 160 having a narrow cross-section at the center thereof are formed.

It is preferable that the silicon nanowire 150 has an intended semiconductor characteristic in order to apply the nanowire manufactured like this to the device. The semiconductor characteristic can be introduced to the silicon nanowire by injecting impurities into whole or portions of the silicon first substrate 100 through a method such as diffusion or ion implantation. The semiconductor characteristic of such silicon nanowire 150 can be controlled according to a type and a doping concentration of the injected impurities.

Figure 2:
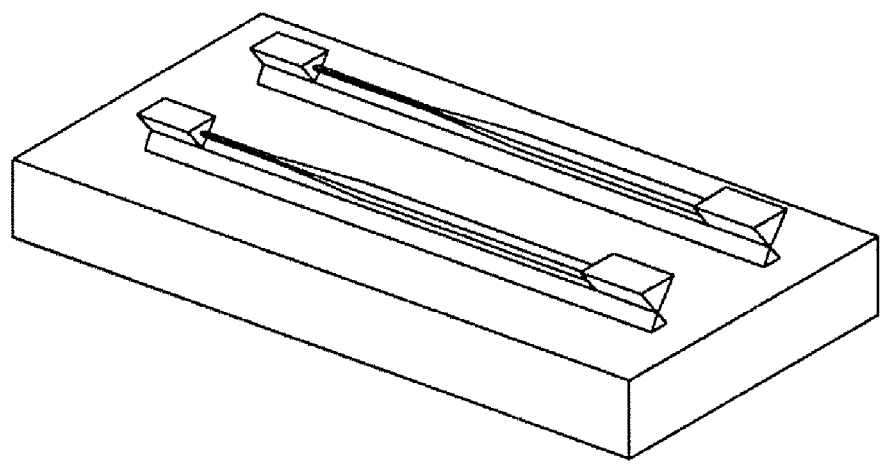
Figure 2:
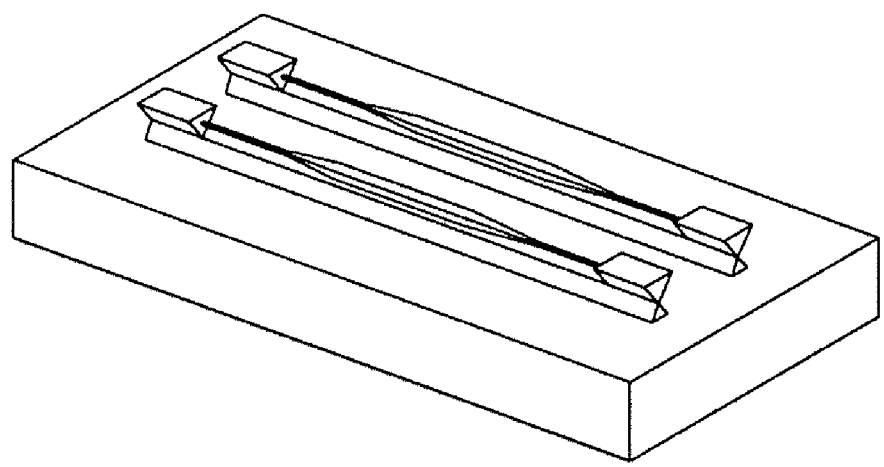

On the other hand, in still another embodiment of the present invention, before forming the first thermal oxidation layer, impurities, preferably boron, are previously doped into both ends of one side end among regions to be formed thereon the nanowire with a high concentration. In the highly doped region, the etching is delayed in comparison with another region at the wet etching process as shown in FIG. 1*b*. As a result, since a thickness of the nanowire of a portion connected to the supporting structure 140 becomes narrower as goes away from the supporting structure 140, a smooth thickness change of the nanowire can be achieved, as shown in FIG. 2*a*. A stress is concentrated on both ends of the nanowire while the nanowire released from the substrate is manufactured. Therefore, if the nanowire is manufactured with a thin thickness, since both side ends thereof become thin, a probability to lose the nanowire due to the stress becomes high. In this result, it is difficult to manufacture further thin nanowire. However, if a method of doping impurities with a high concentration is employed, the stress becomes strong at either side ends or one side end regions of the nanowire formed thick even though the nanowire 150 is formed thin. Therefore, the embodiments of the present invention can be applied to the silicon wire having a thickness being several nanometers or below several nanometers. And also, since a force applied to the nanowire by an adhesive in the following transfer process of the nanowire is concentrated on the both ends of the nanowire, breaks of the nanowire mainly occurs at the both ends of the nanowire.

However, if the both ends or the one side end of the nanowire are manufactured at an appropriate thickness and appropriately changed in thickness, the breaking portion of the nanowire can be controlled during the transfer. And also, a portion of the nanowire where impurities are injected by injecting the impurities into both ends or one-side end regions of the nanowire as well as a central part of the region formed thereon the nanowire becomes thicker than the other region, as shown in FIG. 2*b*. Such applications can further widen the application ranges of the nanowire formed by the present invention.

Figure 3:
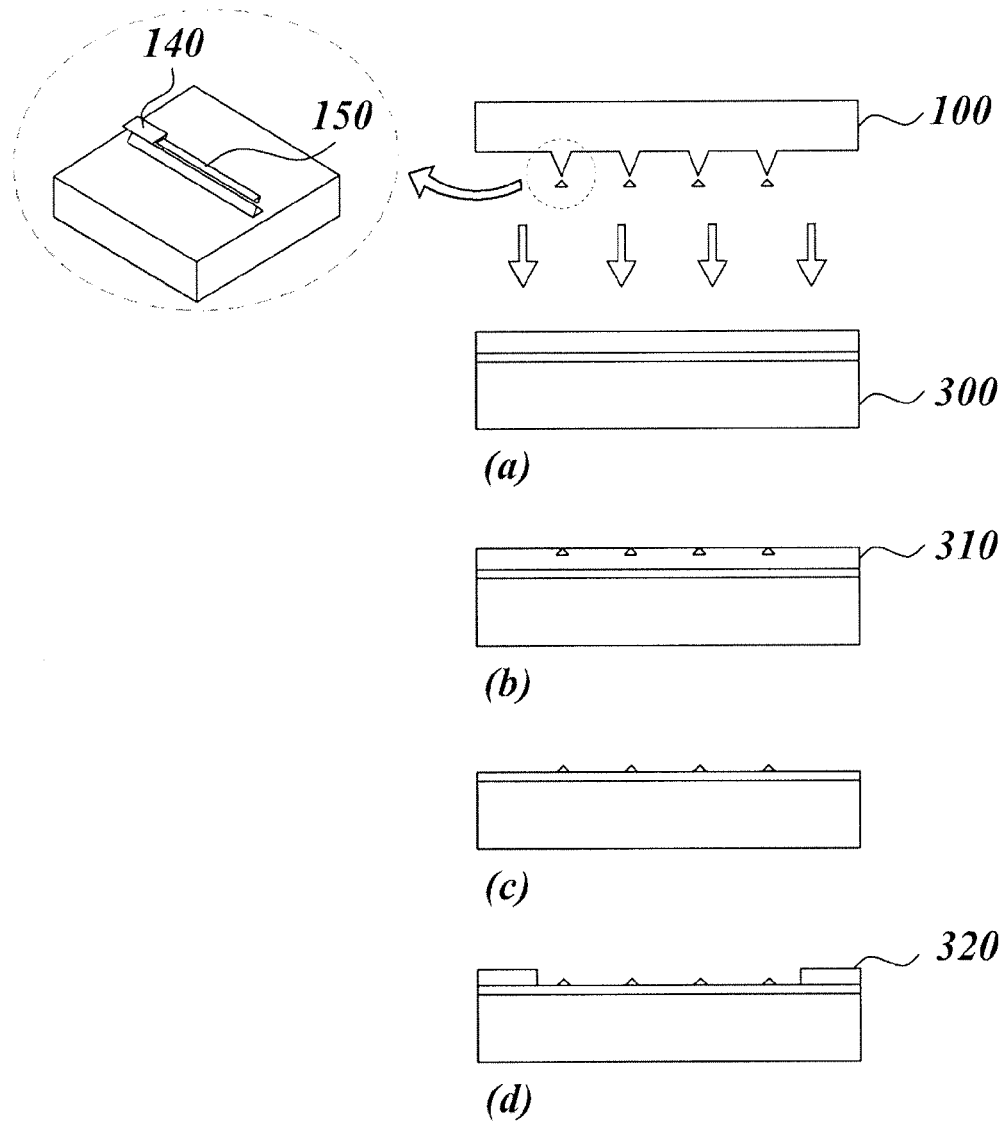

FIG. 3 shows a process for transferring a silicon nanowire 150 formed on a silicon first substrate 100 into a second substrate 300. The transfer of the nanowire includes the steps of: coating an adhesive 310 on the second substrate 300; contacting the silicon first substrate 100 formed thereon the nanowire to the second substrate with facing each other (as shown in FIG. 3*a*); separating the silicon first substrate 100 from the second substrate 300 (as shown in FIG. 5*b*); and removing the adhesive 310 (as shown in FIG. 3*c*). The second substrate 300 to be transferred thereon the nanowire uses a silicon wafer deposited thereon an oxide layer or a nitride layer considering that an electric device is manufactured on the second substrate 300, besides this, a substrate made of crystal, ceramic, glass and polymer or the like can be utilized. At this time, in the second substrate 300, a part of an electrode structure can be previously formed before the transfer.

In case when the second substrate does not have an adhesive characteristic, the adhesive 310 is uniformly coated on the second substrate 300 to perform the nanowire transfer.

The adhesive 310 plays a role of adhering the nanowire 150 and, after the nanowire 150 is transferred, the adhesive 310 can be removed by performing a plasma ashing process. A adhesive polymer and a thermal reflow polymer can be used for the adhesive 310. Among these, when the heat is applied during using the photoresist, the nanowire is easily transferred by using characteristic of the photoresist which is reflowed. Therefore, in the state that the silicon first substrate 100 formed thereon the nanowire 150 is in contact with the second substrate 300 with facing each other, the nanowire 150 can be adhered on the second substrate 300 by applying heat and pressure.

The nanowire 150 can be transferred by using a polymer based adhesive 310 such as the photoresist in the nano scale. Thereafter, although the adhesive 310 is removed, since the transferred nanowire 150 maintains the adhered state to the second substrate 300 by the adhesion, a position of the transferred nanowire 150 to the second substrate 300 does not change greatly after the removal of the adhesive 310. And also, a pattern can be formed on the adhesive 310 by performing a photolithography process or an implanting process on the second substrate 300.

By transferring the nanowire 150 on the adhesive pattern, the nanowire 150 can be transferred only on an intended position of the second substrate 300 to be transferred. By repeatedly performing these, a degree of integration for the nanowire 150 can be improved only at the intended position. And also, a marking pattern for an alignment can be previously formed on the second substrate 300 to be transferred. The marking pattern for the alignment allows the processes to be easily performed by playing roles of alignment markers in proceeding processes such as an adhesive pattern formation, a nanowire transfer and an electrode formation process or the like, and the degree of the integration for the nanowire device can be improved when the nanowire transfer process is repeatedly performed.

On the other hand, according to a method for transferring a silicon nanowire 150 in accordance with another embodiment of the present invention, the silicon nanowire 150 can be transferred by directly supporting the silicon nanowire 150 to the second substrate 300 through various bonding processes without using the adhesive 310. More specifically, it is includes the steps of: contacting the silicon first substrate 100 formed thereon the nanowire 150 to the second substrate 300 with facing each other; adhering the nanowire 150 to the second substrate 300 by applying the heat and the pressure; and separating the silicon first substrate 100 from the second substrate 300. In this case, a flexible substrate having a sticky characteristic itself or a sticky substrate or the like can be used as the second substrate 300, more specifically PDMS(polydimethylsilioxine) or the like can be used.

The heat and the pressure applied to the substrate are determined by a condition to increase a transfer efficiency of the nanowire 150, and they are changed according to material of the substrate to be transferred. And also, in this case, the adhesive pattern can be formed by performing a photolithography process or a hot embossing process on the second substrate 300. And also, the marking pattern for the alignment can be formed on the second substrate 300.

Meanwhile, the transfer of the nanowire 150 can be perform iteratively; and particularly, a nanowire array having a high density or a nanowire assembly having a complex structure such as a stacked structure of the nanowire array and a multi-layered structure can be formed by transferring the nanowire 150 formed on the different substrates to the same second substrate. At this time, in case when the stacked structure and the multi-layered structure of the nanowire array are formed, the transfer after the second transfer performs the nanowire transfer method using the adhesive similar to the other embodiments after the adhesive being thicker than a thickness of the nanowire transferred to the second substrate 300 is coated irregardless of the adhesive characteristic of the previously transferred second substrate 300.

When an electrode structure 320 for an electrical contact is formed on the substrate where the nanowire is transferred, the nanowire device manufacturing process is finished, as shown in FIG. 3*d*. If the metal thin film used as material of the electrode 320 is deposited, since the nanowire is permanently fixed to a surface of the substrate, there is not a concern that the nanowire is lost although another process is added. A process to additionally proceed for forming the electrode 320 on the substrate transferred thereon the nanowire can be processed in the unit of a wafer, and the pattern alignment can be further easily processed by using the alignment pattern of the mask or the marking pattern for the alignment used at the transfer process in case of need.

A method for manufacturing a silicon nanowire device will be described in accordance with another embodiment of the present invention. At first, after the nanowire is formed on the substrate according to a process shown in FIG. 1, the nanowire device is manufactured by forming electrode material on the nanowire supporting structure. In the present embodiment, the nanowire device can be directly formed on the substrate formed thereon the nanowire without transferring the nanowire to the second substrate different from the embodiment to transfer the nanowire.

In the nanowire device in accordance with the present embodiment, the nanowire does not exist on an insulation layer such as an oxide layer. Therefore, in the present embodiment, it is preferable that an intrinsic semiconductor substrate is employed, and when impurities are previously doped into a region to be formed thereon the nanowire, it is preferable that a leakage current of the nanowire device is minimized by not doping the impurities into the substrate region below the nanowire with making the depth of the doping shallow. The nanowire device formed as described above can be used for a conventional nanowire device application as well as can be used for a nanowire resonator used as a very precisely tuned oscillator in a RFC(radio frequency circuit).

More particularly, the nanowire in accordance with the present invention has a further smaller line width in comparison with a conventional method; and, since it can be manufactured at a very low cost, its application range is very wide.

Figure 4:
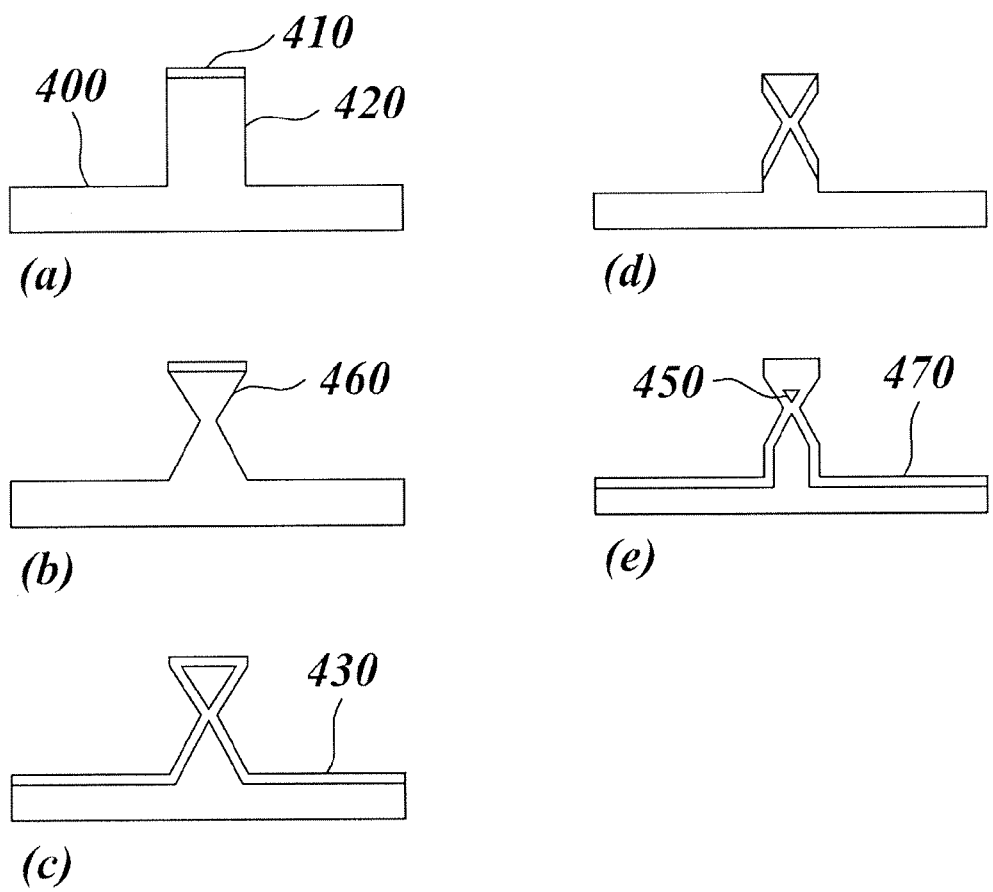
FIGS. 4 and 5 are diagrams representing a method for silicon nanowire and a method for manufacturing a nanowire device in accordance with another embodiment of the present invention.

FIG. 4 shows a process for manufacturing a silicon nanowire in accordance with a still another embodiment of the present invention. A column structure 420 is formed on a silicon first substrate by anisotrophically dry etching the silicon first substrate using a first thermal oxidation layer patterned for the silicon first substrate with a crystal structure of (100) direction as a mask, as shown in FIG. 4*a*. At this time, it is not required that a supporting structure for the nanowire is formed.

The silicon first substrate 400 is wet etched by using a silicon anisotrophical etching solution such as KOH, as shown in FIG. 4*b*. Accordingly, the nanowire structure 460 having a predetermined sloping angle is formed. Again, a second thermal oxidation layer 430 is formed by secondarily thermal oxidizing the silicon first substrate, as shown in FIG. 4*c*.

In the state that the first and the second thermal oxidation layers 410 and 430 are formed, by dry etching the silicon first substrate 400, a top of the silicon on the nanowire structure 460 is exposed by removing an oxide layer on top of the silicon first substrate 400, as shown in FIG. 4*e*.

Thereafter, a third thermal oxidation layer is formed by thirdly thermal oxidizing the silicon first substrate 400, as shown in FIG. 4*e*. A diameter of the silicon nanowire 450 can be controlled in several tens nanometers by controlling deposition times of the second thermal oxidation layer and the third oxidation layer 470.

Figure 5:
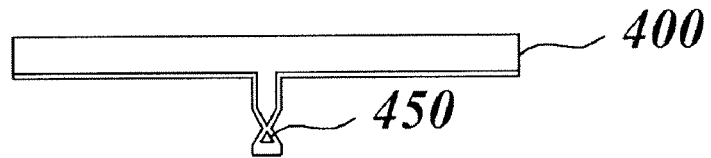
Figure 5:
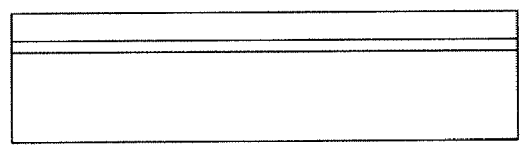
Figure 5:
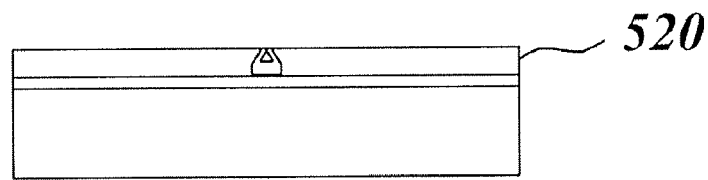
Figure 5:
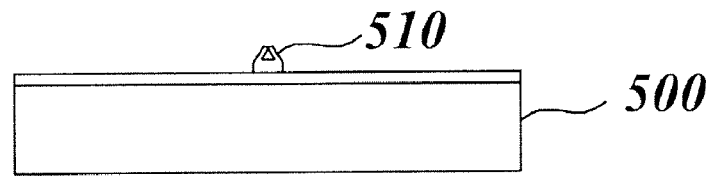
Figure 5:
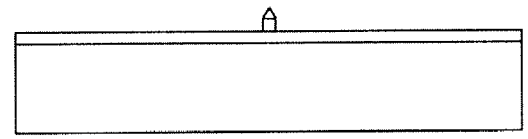
Figure 5:
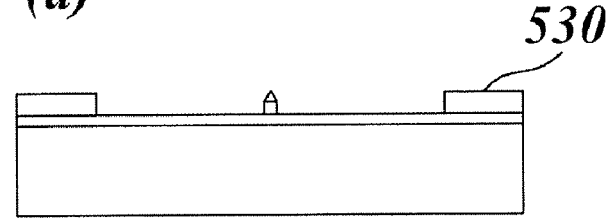

FIG. 5 shows a method for manufacturing a silicon nanowire in accordance with a still another embodiment of the present invention. The nanowire 450 is transferred to the second substrate 500 by using the silicon first substrate 400 formed thereon the silicon nanowire through the process of FIG. 4, as shown in FIGS. 5a to 5c. At this time, although the transfer of the nanowire is finished, the oxidation layer 510 remains on a top portion of the silicon nanowire 650 of the second substrate 500. Therefore, the transfer of the silicon nanowire 450 is finished by the remained oxidation layer 510, as shown in FIG. 5d.

In this case, the HF vapor can be used during the removal of the thermal oxidation layer. Herein, as described in the other embodiments shown in the above, an adhesive 520 is used for the second substrate 500 or the nanowire can be transferred by using a flexible substrate having an adhesive characteristic itself or a sticky substrate or the like as the second substrate 500, and the adhesive pattern or the marking pattern for the alignment are formed and the silicon nanowire 450 can be transferred to the second substrate 500. In the preferred embodiment, since a further strong adhesive force is required in comparison with the embodiment that the nanowire released from the substrate is transferred, it is preferable that a hot embossing method using a plastic substrate or the like is used. Thereafter, the nanowire device manufacturing process is finished by forming the electrode structure 530, as shown in FIG. 5e.

Since the silicon nanowire 450 manufactured in accordance with the present embodiments is removed after the oxidation layers remaining on the substrate 400 and the silicon nanowire 450 are transferred, there is not a concern that the silicon nanowire 450 is lost or damaged.

Figure 6:
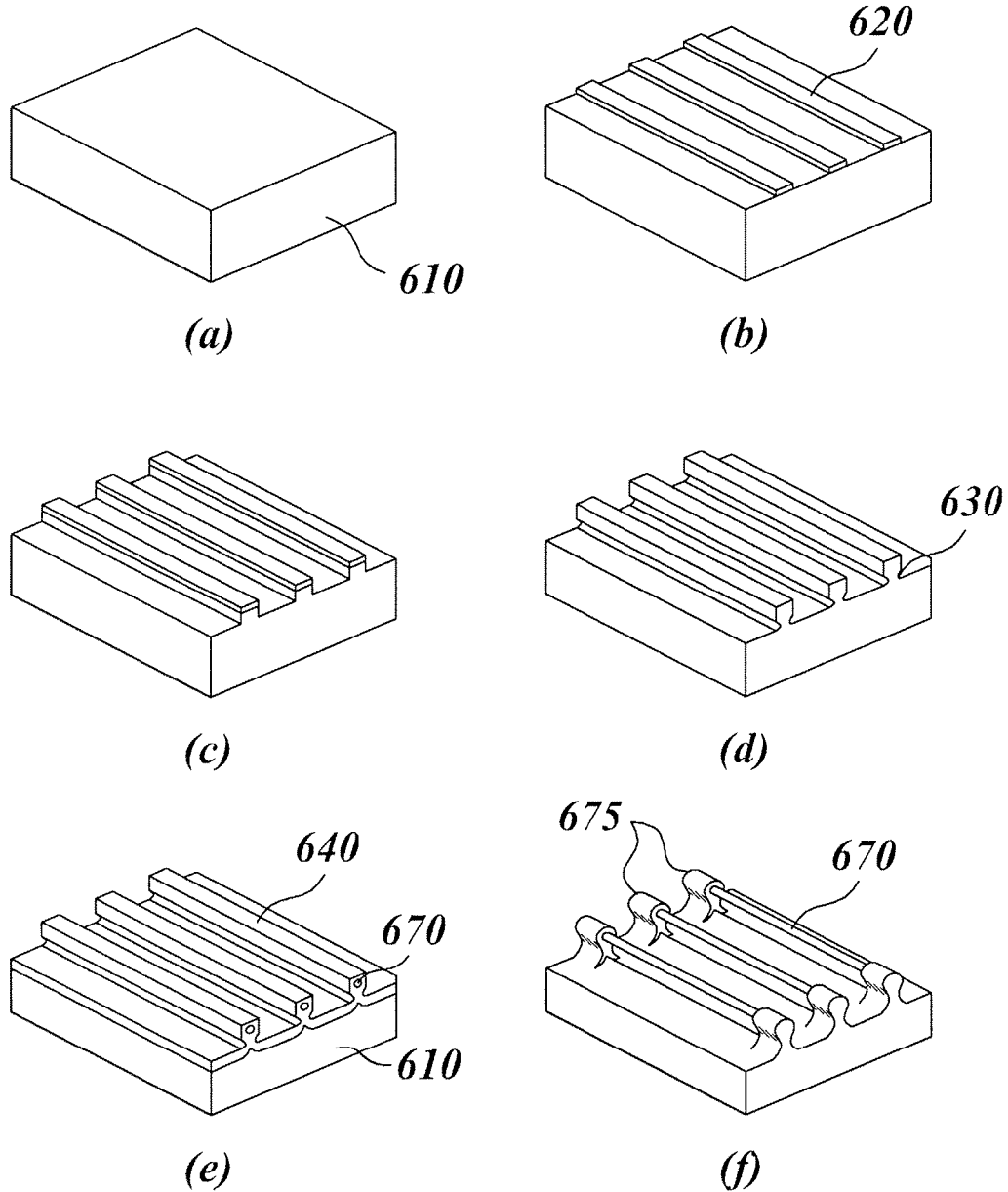
FIGS. 6 and 7 are diagrams describing a method for silicon nanowire and a method for manufacturing a nanowire device in accordance with still another embodiment of the present invention.

FIG. 6 shows a method for manufacturing a silicon nanowire in accordance with a still another embodiment of the present invention. At first, after a silicon first substrate 610 is prepared, a photoresist 620 is patterned through a photolithography etching process, as shown in FIGS. 6a and 6b. The patterned region includes a silicon nanowire and a region for a supporting structure of the silicon nanowire. At this time, the silicon first substrate 610 does not need to have a surface of (100) direction different from the embodiments shown in the above. A vertical trench structure is formed by etching the silicon first substrate 610 using a dry etching process such as a RIE(reactive ion etching), as shown in FIG. 6c. And then, a shape of an undercut 630 is formed below the vertical trench structure by etching the silicon first substrate 610 through a silicon dry etching causing a scallop of a deep RIE, as shown in FIG. 6d.

In this case, the deep RIE can employ Bosch process. Thereafter, a thermal oxidation layer 640 is formed on a silicon first substrate 610 by a thermal oxidation process, as shown in FIG. 6e. The silicon nanowire can be separated from the substrate by the thermal oxidation layer 640 by being completely oxidized at a narrow portion of a bottom region of the silicon nanowire structure through the thermal oxidation forming process. And also, through such thermal process, the silicon nanowire 670 having a diameter ranging from several nanometers to several tens nanometers can be manufactured, and a diameter of the silicon nanowire 670 can be controlled by a control of the thermal oxidation process.

If the oxidation layer 640 is removed by HF vapor or BOE(buffered oxide etchant), the nanowire 670 formed in a size ranging from several nanometers to several tens nanometers is obtained, as shown in FIG. 6f. Even though, if the oxide layer 640 is removed, the nanowire 670 becomes a structure floated in air, the nanowire 670 can be supported by the supporting structure patterned together during forming the pattern for the nanowire 670.

On the other hand, since the silicon nanowire 670 manufactured by this is manufactured by using a dry etching process, a thermal oxidation process and an oxidation layer etching process, it is possible that the nanowire having various shape such as a straight line or a curve can be manufactured by allowing the nanowire to be manufactured without depending on a crystal direction of the silicon substrate 610. The silicon nanowire formed by this is transferred to the second substrate by using a transfer method of the nanowire described above and the silicon nanowire device can be manufactured.

Figure 7:
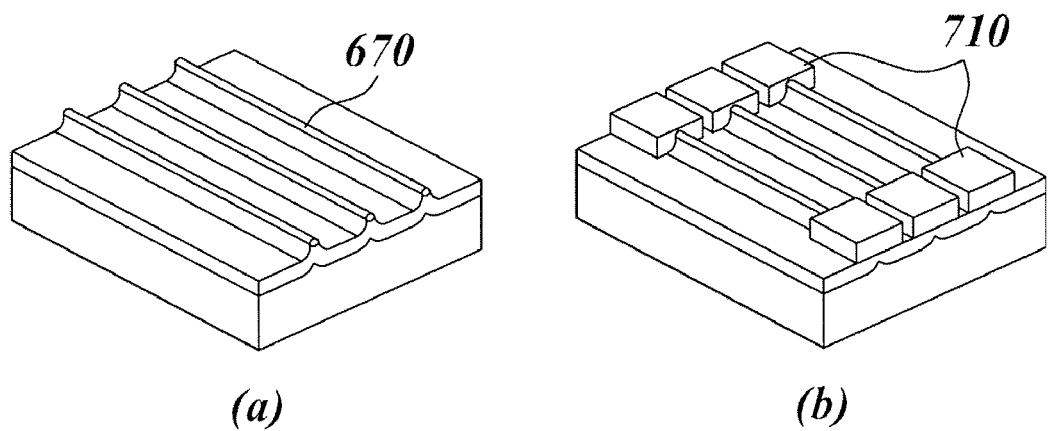

On the other hand, according to the silicon nanowire device manufacturing method in accordance with the still another embodiment of the present invention, after the nanowire is formed on the silicon substrate by the processes shown in FIG. 6a to 6d, the oxidation layer covering the top layer portion of the nanowire 670 is removed by a dry etching of the RIE or a wet etching, as shown in FIG. 7a. Thereafter, an electrode structure 710 is formed for an electric contact, as shown in FIG. 7b.

Accordingly, in the present embodiments, the nanowire device manufacturing process can be formed on the silicon first substrate without using an additional second substrate. On the other hand, after the electrode 710 is formed, the nanowire device of a structure that the nanowire is released from the silicon substrate can be manufactured by removing the oxidation layer below the nanowire. Such nanowire device can be used for a conventional nanowire device application as well as can be used for a nanowire resonator used as a very precisely tuned oscillator in a RFC(radio frequency circuit).

Figure 8:
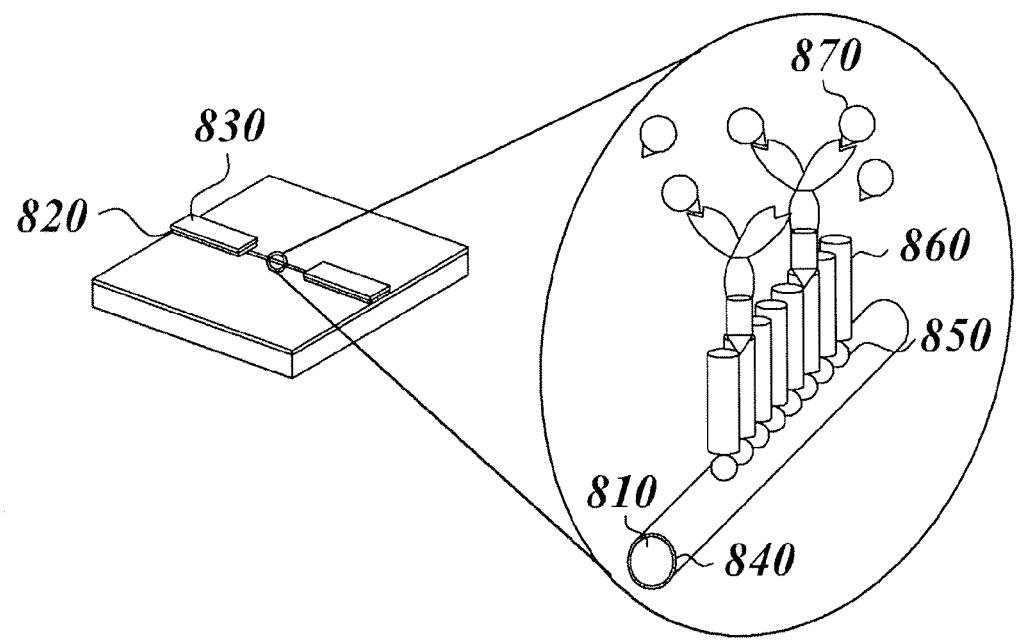
FIG. 8 is a diagram depicting one example of a nanowire biosensor device by using a nanowire device in accordance with the present invention.

FIG. 8 shows an example to manufacture a bio-sensor by using the silicon nanowire device manufactured in accordance with each of the embodiments of the present invention.

Since the bio-sensor utilizes an electrolyte solution as an inspection sample, the electrode 820 is prevented from being in contact with the electrolyte solution by forming an insulating layer 830 on a top of the electrode of the nanowire device so as to reduce a noise and to improve a sensitivity of the bio-sensor. In order to applying a surface of the nanowire 810 as a sensor, the surface of the nanowire 810 is activated by using sulfuric acid or oxygen plasma. And also, an oxidation layer 840 is formed on a surface of the nanowire 810 and a detection target particle 870 such as protein included into the electrolyte solution is captured and detected by forming an organic silane layer 850 and a receptor 860 on the oxidation layer.

The present application contains subject matter related to Korean patent application Nos. 2005-0088325, 2006-0025126 and 2006-0039593 filed in the Korean Patent Office on Sep. 22, 2003, Mar. 20, 2006 and May 2, 2006, respectively, the entire contents of which being incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A method for manufacturing a semiconductor nanowire device from a substrate, the method comprising the steps of:
    forming a first thermal oxide layer on a (100) single crystal silicon first substrate;
    doping impurities of high concentration into a doped region of the first substrate, the doped region comprising a first region, corresponding to a support structure, and a second region, corresponding to a nanowire, the nanowire extending lengthwise from the support structure;

patterning the first thermal oxide layer to form the support structure for supporting the nanowire, the support structure being wider than the nanowire such that the support structure exhibits higher mechanical stress than the nanowire without breaking;

dry etching the silicon first substrate;

wet etching the silicon first substrate by using a silicon anisotropic etching solution;

forming a second thermal oxide layer on the silicon first substrate;

separating the nanowire from the single crystal silicon first substrate by removing the second thermal oxide layer;

separating the nanowire from the support structure by breaking a portion of the doped region; and transferring the nanowire to a second substrate.

2. The method as recited in claim 1, after the step of wet etching the silicon first substrate by using a silicon anisotropic etching solution, further comprises a step of etching the first thermal oxide layer.

3. The method as recited in claim 1, wherein the removal of the thermal oxide is performed by using an HF vapor.

4. The method as recited in claim 1, wherein the impurities are boron.

5. A method for manufacturing a semiconductor nanowire device, the method comprising the steps of:

a step of forming a nanowire by using a method of claim 1; and depositing an electrode material on a nanowire supporting structure.

6. The method as recited in claim 1, wherein:

the doped region further comprises a connecting member positioned between the support structure and the nanowire; and separating the nanowire from the support structure by breaking a portion of the doped region comprises breaking the connecting member.

7. The method as recited in claim 6, wherein the connecting member narrows along its length from the support structure to the nanowire.

8. The method as recited in claim 1, wherein:

the support structure is a first support structure;

the doped region further comprises a third region corresponding to a second support structure, the nanowire extending between the first support structure and the second support structure; and the second support structure is wider than the nanowire such that the second support structure is able to exhibit higher mechanical stress than the nanowire without breaking.

9. The method as recited in claim 8, wherein:

the doped region further comprises a first connecting member positioned between the first support structure and the nanowire, and a second connecting member positioned between the second support structure and the nanowire; and separating the nanowire from the support structure by breaking a portion of the doped region comprises breaking the first connecting member and the second connecting member.

10. The method as recited in claim 9, wherein the second connecting member narrows along its length from the second support structure to the nanowire.

* * * * *